United States Patent
Fischer et al.

(10) Patent No.: US 6,242,360 B1
(45) Date of Patent: Jun. 5, 2001

(54) PLASMA PROCESSING SYSTEM APPARATUS, AND METHOD FOR DELIVERING RF POWER TO A PLASMA PROCESSING

(75) Inventors: Andreas Fischer, Fremont; Babak Kadkhodayan, Oakland; Andras Kuthi, Thousand Oaks, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/342,969

(22) Filed: Jun. 29, 1999

(51) Int. Cl.$^7$ ............................................. H01L 21/00
(52) U.S. Cl. ........................ 438/710; 156/345; 438/729
(58) Field of Search ................................. 438/710, 729; 216/67; 156/345 P

(56) References Cited

U.S. PATENT DOCUMENTS

| | | | |
|---|---|---|---|
| 3,941,966 | 3/1976 | Schatz | 219/10.49 |
| 5,187,454 | 2/1993 | Collins et al. | 333/17.3 |
| 5,463,526 | 10/1995 | Mundt | 361/234 |
| 5,478,429 | 12/1995 | Komino et al. | 156/345 |
| 5,609,720 | 3/1997 | Lenz et al. | 156/643.1 |
| 5,670,066 | 9/1997 | Barnes et al. | 219/121.58 |
| 5,671,116 | 9/1997 | Husain | 361/234 |
| 5,689,215 | 11/1997 | Richardson et al. | 333/17.3 |
| 5,708,250 | 1/1998 | Benjamin et al. | 219/121.58 |
| 5,737,175 | 4/1998 | Grosshart et al. | 361/234 |
| 5,793,162 | 8/1998 | Barnes et al. | 315/111.21 |
| 5,793,192 | 8/1998 | Kubly et al. | 323/312 |
| 5,798,904 | 8/1998 | Guyot | 361/234 |
| 6,106,660 * | 8/2000 | Chen | 156/345 |

FOREIGN PATENT DOCUMENTS 0732 728 A2   8/1996  (EP) .
WO 00/30149   5/2000  (WO) .

OTHER PUBLICATIONS

M. Lieberman and A. Lichtenberg, "Principles of Plasma Discharges and Materials Processing", Wiley–Interscience Publ., John Wiley & Sons, Inc. (1994).

* cited by examiner

*Primary Examiner*—William Powell
(74) *Attorney, Agent, or Firm*—Martine Penilla & Kim, LLP

(57) ABSTRACT

The present invention provides a plasma processing apparatus, system, and method for providing RF power to a plasma processing chamber. The plasma processing system includes an RF generator, a plasma chamber, a match network box, a first cable, a second cable, and means for electrically isolating the match network box. The RF generator is generates RF power for transmission to the plasma chamber. The plasma chamber receives the RF power for processing the wafer and is characterized by an internal impedance during the plasma processing. The plasma chamber has one or more walls for returning RF currents. The match network box is capable of receiving the RF currents and generates an impedance that matches the internal impedance of the plasma chamber to the impedance of the RF generator. The first cable is coupled between the RF generator and the match network box for transmitting RF power between the RF generator and the match network box. The second cable is coupled between the match network box and the plasma chamber for transmitting RF power between the match network and the plasma chamber. The second cable provides a return path for an RF return current from the plasma chamber to the match network box. The electrically isolating means electrically isolates the match network box from electrical contacts with the plasma chamber such that only the second cable provides the return path for the RF return current from the plasma chamber to the match network box.

21 Claims, 4 Drawing Sheets

US 6,242,360 B1

PLASMA PROCESSING SYSTEM APPARATUS, AND METHOD FOR DELIVERING RF POWER TO A PLASMA PROCESSING

BACKGROUND OF THE INVENTION

1. Field of the Invention

The present invention relates to the manufacture of semiconductor devices. More specifically, the present invention relates to plasma processing systems which deliver RF power to a plasma processing chamber.

2. Description of the Related Art

Semiconductor processing systems are used to process semiconductor wafers for fabrication of integrated circuits. In particular, plasma-based semiconductor processes are commonly used in etching, oxidation, chemical vapor deposition (CVD), etc. The plasma-based semiconductor processes are typically carried out by means of plasma processing systems and generally include a plasma processing chamber to provide a controlled setting.

FIG. 1 illustrates a schematic block diagram of an exemplary conventional plasma processing system 100 used for processing a semiconductor wafer 102. The plasma processing system 100 includes a plasma processing chamber 104, a shield box 106, a network match box 108, and an RF generator 110. The RF generator 110 is coupled to the match network box 108 by a co-axial cable 112. The shield box 106 is arranged to house or shield a co-axial cable 114, which couples the match network box 108 to the plasma processing chamber 104. A helium box 124, which is mounted on top of shield box 106, is used for supplying helium to the plasma processing chamber 104.

The plasma processing chamber 104 includes a shower head 116 and an electrostatic chuck 118. The shower head 116 is adapted to release a source gas into the chamber 104 for generating plasma over the wafer 102. The ESC 118 includes one or more dielectric layers 120 disposed over an electrode 122. The electrostatic chuck 118 functions to hold the wafer 102 in place for processing. The helium from the helium box 124 is provided through a port 140 to control the temperature of the wafer 102. The plasma processing system 100 also includes an ESC power supply (not shown) for supplying power to the ESC.

Electrostatic chucks are well known in the art and are amply described, for example, in commonly owned U.S. Pat. No. 5,789,904 by Francois Guyot and entitled "High Power Electrostatic Chuck Contact," U.S. patent application Ser. No. 08/624,988 by Jones et al. and entitled "Dynamic Feedback Electrostatic Wafer Chuck," U.S. patent application Ser. No. 08/550,510 by Castro et al., and U.S. Pat. No. 5,793,192 by Kubly et al. and entitled "Methods and Apparatus for Clamping and Declamping a Semiconductor Wafer in a Wafer Processing System." The disclosures of these references are incorporated herein by reference.

For wafer processing, the RF generator 110 provides RF power to the plasma processing chamber 104. Specifically, the RF generator 110 generates RF power, which is transmitted to the network match box 108 over the co-axial cable 112. The network match box 108 houses a matching network circuit 126, which produces an impedance match between the plasma processing chamber 104 and the RF generator 110 during wafer processing. The network match box 108 transmits RF power over the co-axial cable 114 to the plasma processing chamber 104. The matching network circuit is provided between the RF generator 106 and the plasma processing chamber 104 to minimize reflection of RF power from the plasma processing chamber 104. It typically includes two or more variable impedance elements (e.g., capacitors, inductors). RF match network circuits are well known in the art and are described, for example, in U.S. patent application No. 5,187,454 by Collins et al. and U.S. patent application Ser. No. 09/218,542 by Arthur M. Howald and filed on Dec. 22 1998. The disclosures of these references are incorporated herein by reference.

In high and medium density plasma etching, semiconductor manufacturers have been using electrical plasma parameters such as the DC bias voltage and the bias peak-to peak voltage to monitor the plasma processing in real time. For example, a DC voltage is typically developed over the wafer 102 and a peak-to-peak voltage can be measured from the electrode 122 during the operation of the plasma processing system 100. These electrical parameters are often used to diagnose, and if necessary, to interrupt the plasma process to achieve desired plasma processing. These electrical parameters are typically highly sensitive not only to the plasma density and plasma distribution inside the plasma chamber 104, but also to the spatial distribution of the RF return currents outside the plasma, i.e., through the walls of the plasma chamber 104, the RF delivery system, and the chassis of the RF matching network.

For example, the plasma processing system 100 of FIG. 1 delivers forward RF power to the electrode 122 of the ESC 118 via co-axial cable 114 as indicated by arrow 128. The RF power energizes the electrode 122, which attracts plasma ions toward the wafer 102 for plasma processing. The walls 130 of the plasma processing chamber 104 provide "return" paths for RF currents to return to the match network box 108 and eventually to the RF generator 110, thereby forming a closed circuit. Conventional wafer processing systems typically provide as much metal-to-metal surface contact to maximize RF current return paths from the plasma processing chamber 104 to the match network box 108. For instance, the plasma chamber 104, shield box 106, and the match network box 108 are typically formed of a metal (e.g., aluminum) for conducting electricity. Hence, RF currents travel from the walls 130 of the plasma chamber 104 as indicated by arrows 132 over any metal-to-metal contact paths leading to the match network box 108. Providing as much metal-to-metal contacts for return paths is in accordance with industry standard rule of thumb. For example, designers of plasma processing systems have typically tried to achieve the lowest impedance for RF return current. The lowest impedance is usually achieved by providing as much metal-to-metal contact in the plasma processing systems.

One of the main RF current return paths originates from the walls 130 to the match network box 108 along the coaxial cable 114 as indicated by arrows 134. In this case, the RF return currents travel along the surface of an outer conductor of the coaxial cable 114. In addition, RF currents also travel along other return paths over metal-to metal surfaces of the plasma processing chamber 104, the shield box, and the match network box 108. In this manner, the plasma processing system 100 is designed to provide as many return paths for RF currents as possible to capture as much stray currents as possible to ensure their return to the match network 126.

For high wafer yield, it is desirable to maintain consistent and uniform RF return currents in the plasma processing system 100. Unfortunately, however, providing such metal-to-metal contacts for maximum RF return paths degrades wafer processing over time. For example, the match network box 108 is securely attached to the shield box 106 using a plurality of bolts, screws, etc. through a metal plate (e.g., aluminum plate) disposed between the boxes 108 and 106. During the life of the plasma processing system 100, the match network box 108 is often removed from the shield box 106 for routine maintenance or modification. After the maintenance, the match network box is securely re-attached to the shield box by means of an aluminum plate and metal bolts, screws, etc.

The re-attachment of the match network box 108, however, generally does not precisely duplicate the metal-to-metal contacts existing prior to the removal. For example, the bolts or screws may not be screwed on exactly as before the removal. Thus, the changed metal-to-metal contact characteristics may change the RF current return path characteristics, which in turn lead to changes in the overall magnitude of RF return currents and in the electrical characteristics of the wafer processing. In addition, the use of aluminum for the plasma chamber walls 103 and the boxes 106 and 108 often lead to oxidation on the metal surface over time. That is, oxide layers may form on the metal surface, thereby changing the RF current return path characteristics.

In view of the foregoing, what is needed is an apparatus and method for providing consistent and uniform RF return currents in a plasma processing system to enhance the precision and uniformity of wafer processing results.

SUMMARY OF THE INVENTION

Broadly speaking, the present invention fills these needs by providing a system, apparatus, and method for delivering RF power to a plasma processing chamber. It should be appreciated that the present invention can be implemented in numerous ways, including as a process, an apparatus, a system, a device, a method, or a computer readable medium. Several inventive embodiments of the present invention are described below.

In accordance with one embodiment, the present invention provides a plasma processing system for delivering RF power to a plasma processing chamber. The plasma processing system includes an RF generator, a plasma chamber, a match network box, a first cable, a second cable, and means for electrically isolating the match network box. The RF generator is arranged to generate RF power for transmission to the plasma chamber. The plasma chamber is configured to receive the RF power for processing the wafer and is characterized by an internal impedance during the plasma processing. The plasma chamber has one or more walls for returning RF currents. The match network box is capable of receiving the RF currents and is configured to generate an impedance that matches the internal impedance of the plasma chamber to an impedance of the RF generator. The first cable is coupled between the RF generator and the match network box for transmitting RF power between the RF generator and the match network box. The second cable is coupled between the match network box and the plasma chamber for transmitting RF power between the match network and the plasma chamber. The second cable provides a return path for an RF current from the plasma chamber to the match network box. The electrically isolating means electrically isolates the match network box from electrical contacts with the plasma chamber such that only the second cable provides the return path for the RF current from the plasma chamber to the match network box.

In another embodiment, the present invention provides an apparatus for supplying RF power to a plasma processing chamber. The apparatus includes an RF generator, a plasma chamber, means for housing a match network circuit, first and second means for transmitting RF power, means for electrically isolating the match network box, and means for shielding the second means for transmitting RF power. The RF generator generates RF power for transmission and is characterized by an impedance. The plasma chamber is arranged to receive the RF power for processing the wafer and is characterized by an internal impedance during plasma processing. The plasma chamber has one or more walls for returning RF currents. The match network housing means houses a match network circuit that is arranged to generate an impedance, which matches the internal impedance of the plasma chamber to the impedance of the RF generator. The match network circuit is capable of receiving the RF currents. The first means is coupled between the RF generator and the match network housing means for transmitting RF power between the RF generator and the match network housing means. The second means is coupled between the match network housing means and the plasma chamber for transmitting RF power between the match network circuit and the plasma chamber. The second coaxial cable also provides a return path for an RF current from the plasma chamber to the match network housing means. The isolating means electrically isolates the match network housing means from electrical contacts with the plasma chamber such that only the second means provides the return path for the RF current from the plasma chamber to the match network housing means. The shielding means is coupled between the plasma chamber and the match network box for shielding the second means for transmitting the RF power. The isolating means blocks all return paths of the RF currents from the shielding means to the match network housing means.

In yet another embodiment, a method is provided for delivering RF power to a plasma processing chamber. The method includes: (a) providing a wafer in a plasma processing chamber that is characterized by an internal impedance during wafer processing; (b) generating RF power, by an RF generator, for use in the plasma processing chamber; (c) receiving the RF power over a first cable and producing an impedance, which matches the internal impedance of the plasma chamber to an impedance of the RF generator; (d) transmitting the RF power over a second cable to the plasma processing chamber for processing the wafer, the plasma processing chamber being configured to transmit RF currents; and (e) allowing only one RF return current to be transmitted from the plasma processing chamber over the second cable.

Advantageously, the present invention eliminates all RF current return paths except the main RF current return path by electrically isolating the body of the RF matching network from the chassis of the RF shield box. In a preferred embodiment, a non-conducting plate is provided between the matching network box and the RF shield box to electrically isolate the RF matching network box. The non-conducting plate blocks substantially all stray return RF currents while allowing the RF current to return over the main RF current return path. By thus providing a single RF current return path, the present invention enhances precision and uniformity of wafer processing results. These and other advantages of the present invention will become apparent upon reading the following detailed descriptions and studying the various figures of the drawings.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

An invention is described herein for a system, apparatus, and method for delivering RF power to a plasma processing chamber. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

The present invention eliminates all RF current return paths except the main RF current return path by electrically isolating the body of the RF matching network from the chassis of the RF shield box. Providing only a single current return path in a plasma processing system directly contradicts conventional teachings of providing as many return paths as possible. In a preferred embodiment, a non-conducting plate is provided between the matching network box and the RF shield box to electrically isolate the RF matching network box. In this manner, substantially all stray return RF currents are eliminated while a single RF current return path is provided to the matching network through a coaxial cable. By thus providing a single RF current return path, the present invention enhances precision and uniformity of wafer processing results.

Figure 1:
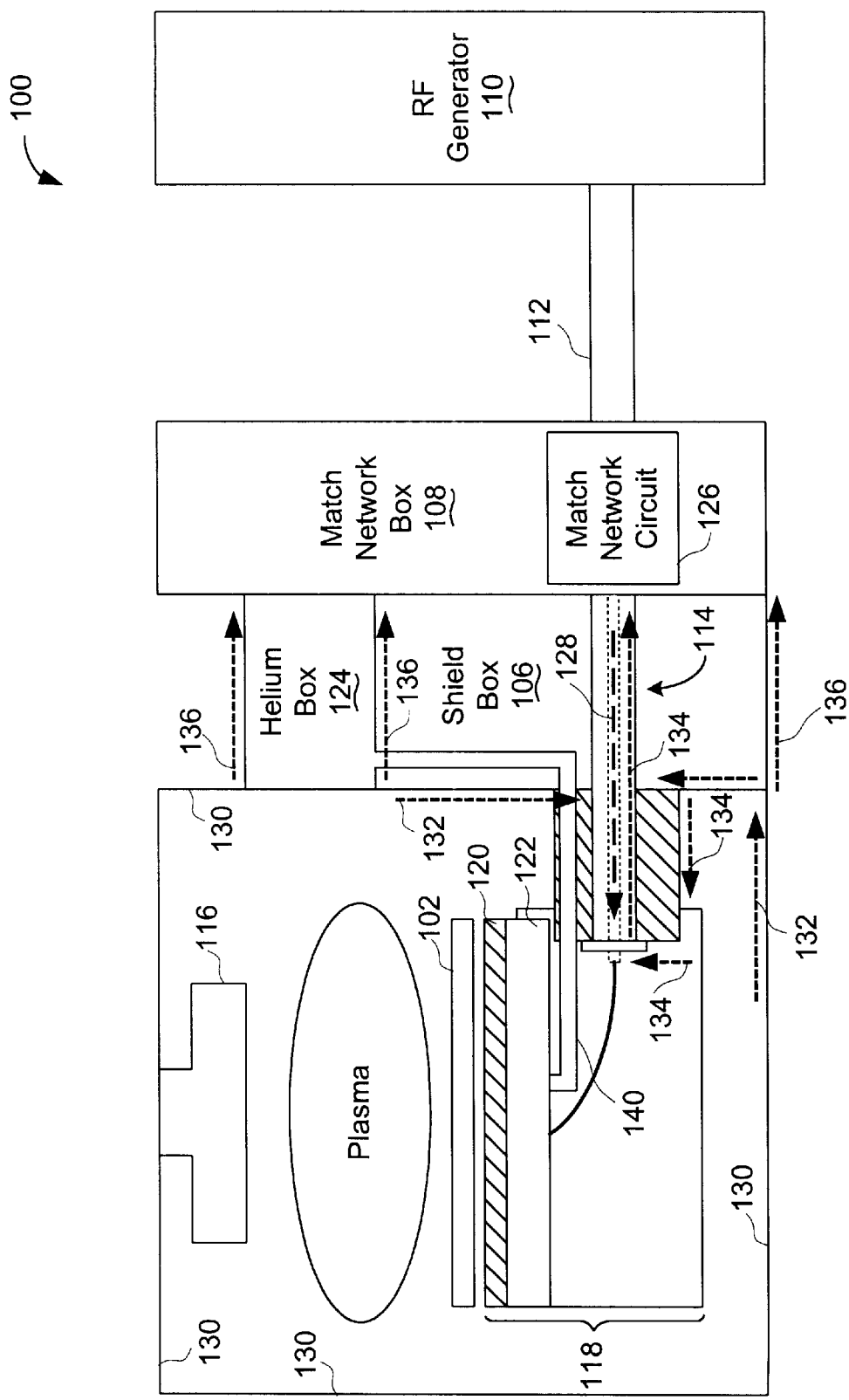
FIG. 1 illustrates a schematic block diagram of an exemplary conventional plasma processing system used for processing a semiconductor wafer.
Figure 2:
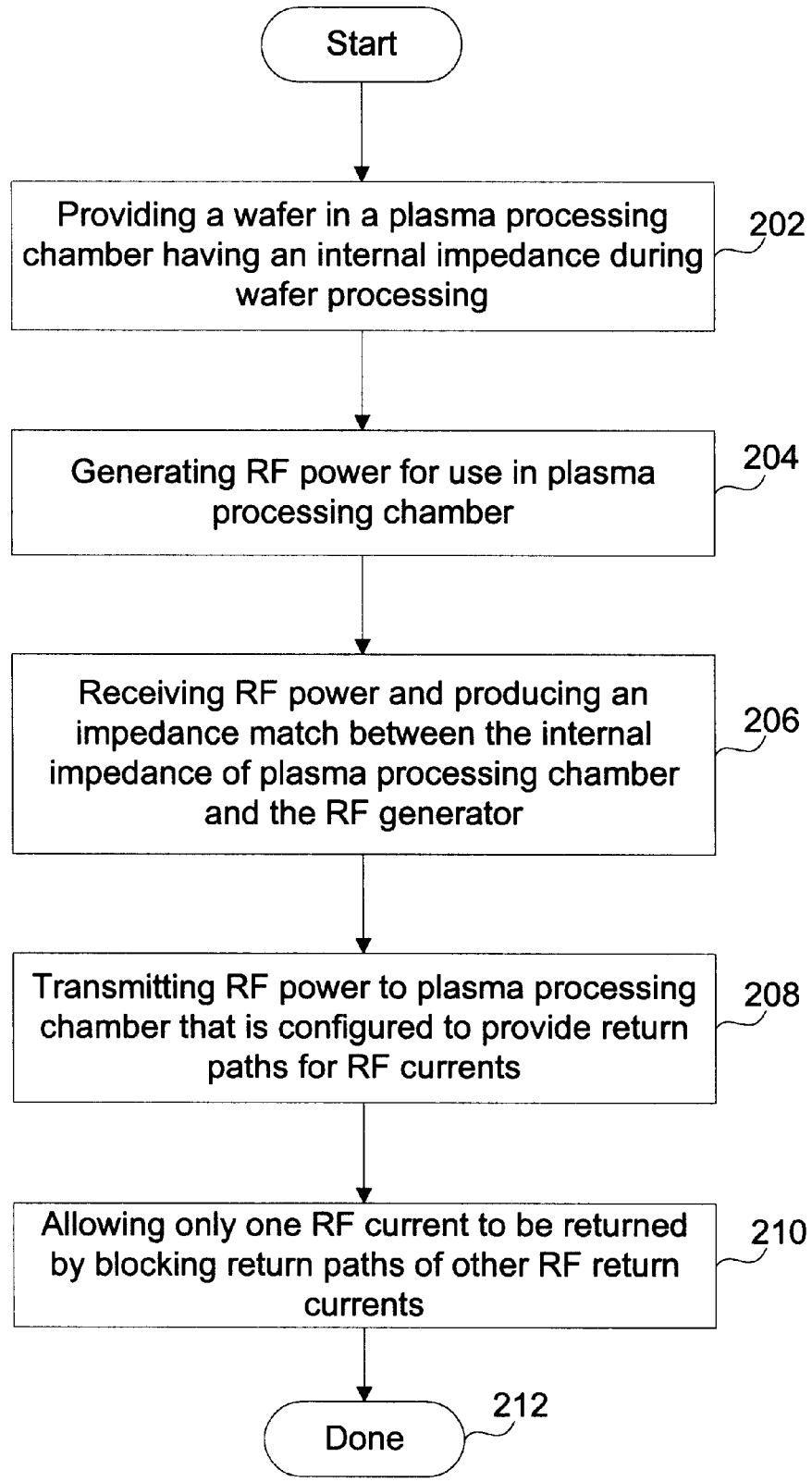
FIG. 2 shows a flowchart of an exemplary method for delivering RF power to a plasma processing chamber in accordance with one embodiment of the present invention.

FIG. 2 shows a flowchart of an exemplary method for delivering RF power to a plasma processing chamber in accordance with one embodiment of the present invention. The method provides a wafer in a plasma processing chamber in operation 202. The plasma processing chamber is characterized by an internal impedance during wafer processing. Then in operation 204, RF power is generated for use in the plasma processing chamber. Next, a match network receives the RF power and produces an impedance, which matches the internal impedance of the plasma processing chamber to the impedance of the RF generator in operation 206. The match network then transmits RF power to the plasma processing chamber in operation 208. The walls of the plasma processing chamber function as return paths for RF currents to return to the match network. Then in operation 210, only one RF return current is allowed to be transmitted over a single RF current return path by blocking all return paths of the other RF return currents. Preferably, the single RF current return path is over a co-axial cable that connects the match network to the plasma processing chamber. The method then terminates in operation 212.

Figure 3:
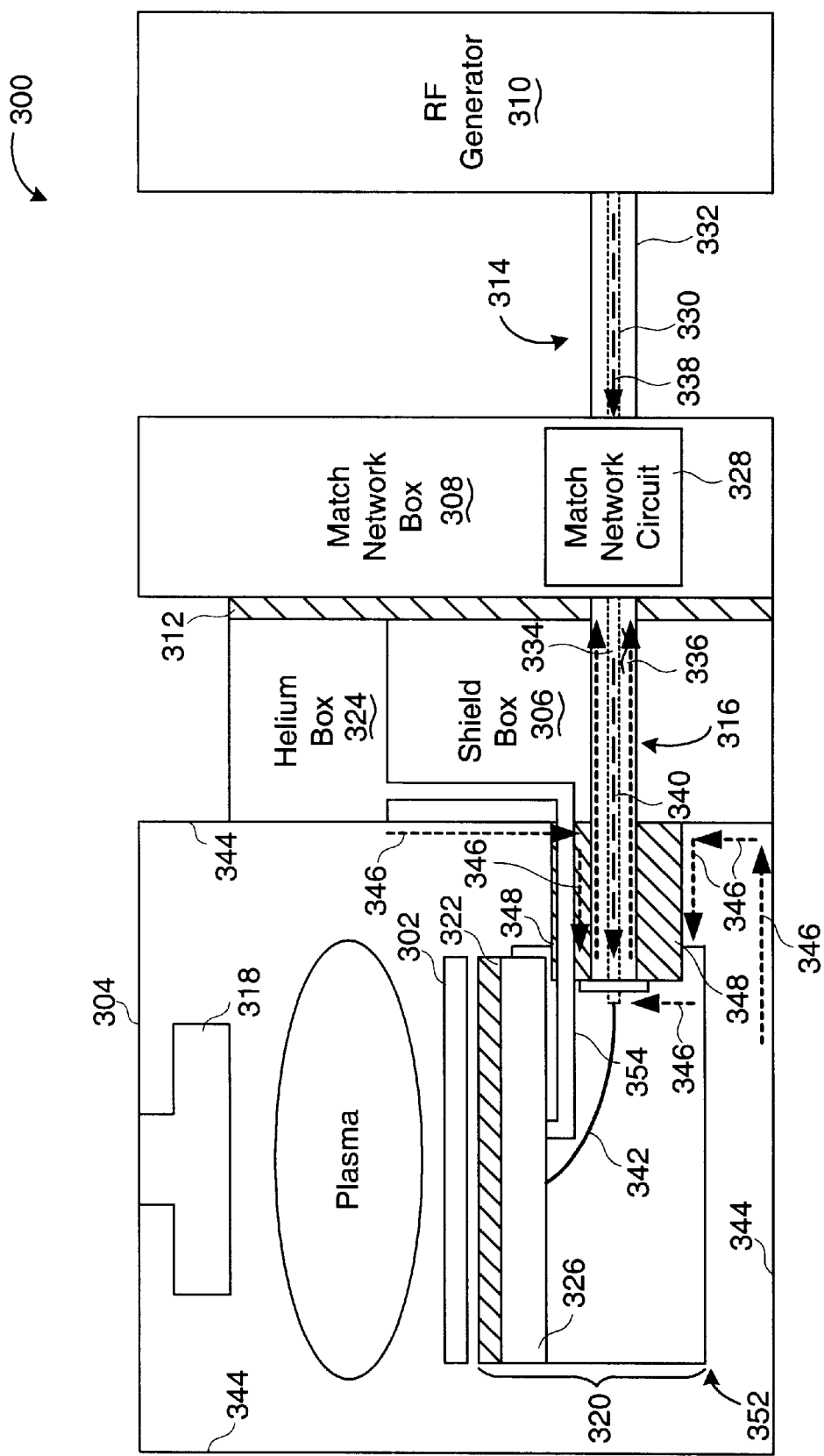
FIG. 3 illustrates an exemplary plasma processing system for processing a semiconductor wafer by using RF power in accordance with one embodiment of the present invention.

FIG. 3 illustrates an exemplary plasma processing system 300 for processing a semiconductor wafer 302 by using RF power in accordance with one embodiment of the present invention. The plasma processing system 300 includes a plasma processing chamber 304, a shield box 306, a network match box 308, and an RF generator 310. The RF generator 310 is coupled to the match network box 308 by a cable 314. The shield box 306 is arranged to shield a cable 316, which is preferably a rigid cable. The cables 314 and 316 are preferably coaxial cables having inner conductors 330 and 334, respectively, and outer conductors 332 and 336, respectively, for carrying RF currents. The cable 316 is preferably a rigid cable and couples the match network box 308 to the plasma processing chamber 304 for delivering RF power and returning RF return current. A helium box 324 is disposed over the shield box 306 for supplying helium to the plasma processing chamber 304 via a helium port 354. The term "box" as used herein refers to any suitable means for housing its internal elements and may be used interchangeably with terms such as housing, container, crate, chest, carton, receptacle, or the like.

The plasma processing chamber 304 includes a shower head 318 and an electrostatic chuck 320. The shower head 318 is configured to release a source gas into the chamber 304 for generating plasma over the wafer 302. The ESC 320 includes one or more dielectric layers 322 disposed over an electrode 326. The electrostatic chuck 320 is arranged to clamp the wafer 302 in place for processing. The helium from the helium box 324 is used to control the temperature of the wafer 302 during the wafer processing.

The plasma processing system 300 also provides a non-conducting plate 312 between the shield box 306 and the match network box 308 for electrically isolating the match network box 308 such that metal-to-metal surface contacts with the shield box 306 or the plasma chamber 304 are eliminated. The non-conducting plate 312 is preferably a mounting plate for the match network box and made of non-conducting or insulating material such as Delrin™, polymers, plastics, nylons, or the like.

In this arrangement, the RF generator 310 generates and transmits forward RF power and current to the network match box 308 over the inner conductor 330 of the cable 314 as indicated by arrow 338. The network match box 308 houses a matching network circuit 328 for generating an impedance which matches the internal impedance of the plasma processing chamber 304 to the impedance of the RF generator. The matching network circuit 328 is provided between the RF generator 306 and the plasma processing chamber 304 to minimize reflection of RF power from the plasma processing chamber 304. It typically includes two or more variable impedance elements (e.g., capacitors, inductors).

The network match box 308 transmits forward RF power and current over the inner conductor 334 of the co-axial cable 316 as indicated by arrow 340 to the plasma processing chamber 304. Specifically, the RF power and current, as indicated by arrow 340, is delivered to the electrode 326 of the ESC 320 via co-axial cable 316 and a strap 342 coupled between the electrode 326 and the inner conductor 334. In response, the electrode 326 attracts plasma ions toward the wafer 302 for plasma processing, which may include etching, oxidation, chemical vapor deposition (CVD), or the like. It should be appreciated that the plasma processing system 300 is described in detail herein to facilitate understanding of the advantages of the present invention. However, the invention itself is not limited to any particular type of wafer processing apparatus or system and may be adapted for use in any suitable wafer processing systems, including but not limited to those adapted for deposition, oxidation, etching (including dry etching, plasma etching, reactive ion etching (RIE), magnetically enhanced reactive ion etching (MERIE), electron cyclotron resonance (ECR)), or the like.

The plasma processing chamber 304 has walls 344 that provide "return" paths for RF currents to return to the match network box 308, thereby forming a closed circuit. Specifically, the RF currents travel to a clamp 350 from the walls 344 via the surface of a metal bar 348 as indicated by arrows 346. The metal bar 348 is securely mounted on an ESC housing 352 that operatively houses the ESC 320 and a portion of coaxial cable 316. The ESC housing is securely attached to an internal wall 344 of the plasma processing chamber 304. Hence, the walls 344 of the plasma processing chamber 304 are in metal-to-metal contact with the ESC housing 352.

Within the ESC housing 352, the clamp 350 fastens one end of the co-axial cable 316 to the metal bar 348. Both, the bar 348 and the clamp 350, are preferably made of a metal such as silver-coated brass (i.e., Ag-coated) to conduct RF current. The metal bar 348 is in closed contact with the clamp 350 and the ESC housing 352 to allow transmission of RF return currents. Hence, the RF currents from the walls 344 are returned to the match network box 308 over the outer conductor 336 of the cable 316 via the metal bar 348 and the clamp 350. This current return path is preferably the only current path allowed to transmit RF return currents from the plasma processing chamber 304 to the match network circuit 328 and eventually to the RF generator 310.

On the other hand, the non-conducting plate 312 electrically isolates the match network box 308 so as to block substantially all other stray RF currents from the surface of the shield box 306. The elimination of the stray currents allows consistent and predictable RF return current along the outer conductor of the coaxial cable 316. The consistent and predictable RF return current, in turn, allows plasma processing of wafers with a high degree of precision and repeatability.

For example, providing a single RF return current path while eliminating other stray return currents may reduce the bias peak-to-peak voltage variance from as much as 150 mV out of 1.5 V to less than ±30 mV out of 1.5 V and the DC bias voltage variance from more than 80 V out of 350 V to ±20V out of 350 V. These reduced variances allow higher yield on wafers by providing a higher degree of precision in monitoring real time plasma processing of wafers in a plasma processing chamber.

Figure 4:
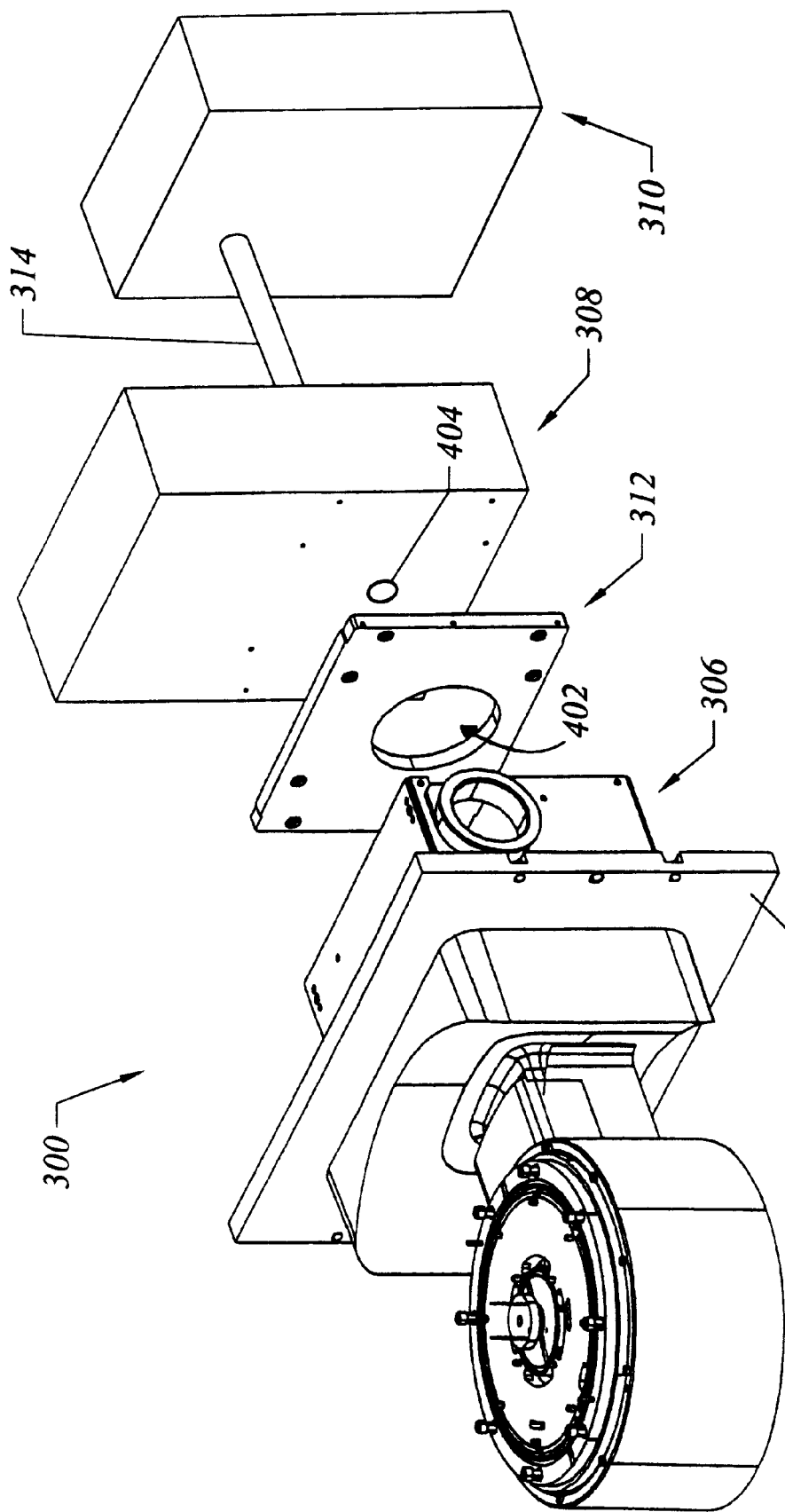
FIG. 4 shows a perspective view of the exemplary plasma processing system with a network match box and a plate detached from a shield box.

FIG. 4 shows a perspective view of an exemplary plasma processing system 300 with the network match box 308 and the plate 312 detached from the shield box 306. The plasma processing system 300 is shown to include an ESC housing 352 attached to a wall 344 of the plasma processing chamber 304. The shield box 306 is attached to the other side of the wall 344 of the plasma processing chamber 304. The RF generator 310 is coupled to the match network box 310 via the cable 314.

As shown, the plate 312 has an opening 402 to allow the cable 316 to pass through for transmitting RF power. The network match box 308 also includes an opening 404, which allows the cable 316 to be coupled to the match network circuit 328 disposed within. The plate 312, when provided between the shield box 306 and the match network box 308, is arranged to block all RF current return paths via the shield box 306. Accordingly, the RF return current is allowed to be transmitted only through the outer conductor of the cable 316.

The present invention, a system, apparatus, and method for delivering RF power to a plasma processing chamber, is thus described. While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A plasma processing system for delivering RF power to a plasma processing chamber for processing a wafer, comprising:

an RF generator for generating RF power;

a plasma chamber arranged to receive the RF power for processing the wafer, the plasma chamber being characterized by an internal impedance during the plasma processing, the plasma chamber having at least one wall for returning RF currents;

a match network box for generating an impedance that matches the internal impedance of the plasma chamber to an impedance of the RF generator, the match network box capable of receiving the RF currents;

a first cable coupled between the RF generator and the match network box for transmitting RF power between the RF generator and the match network box;

a second cable coupled between the match network box and the plasma chamber for transmitting RF power between the match network and the plasma chamber, the second cable providing a return path for an RF return current from the plasma chamber to the match network box; and means for electrically isolating the match network box from electrical contacts with the plasma chamber such that only the second cable provides the return path for the RF return current from the plasma chamber to the match network box.

2. The system as recited in claim 1, further including a shield box coupled between the plasma chamber and the match network box for shielding the second cable, wherein the isolating means blocks other return paths of the RF return currents from the shield box to the match network box.

3. The system as recited in claim 2, wherein the first and second cables are coaxial cables, each of which has an inner conductor and an outer conductor.

4. The system as recited in claim 3, wherein the inner conductors of the first and second cables transmit RF forward current and forward power and the outer conductors of the first and second cables transmit the RF return current.

5. The system as recited in claim 3, wherein the second cable is a rigid coaxial cable.

6. The system as recited in claim 2, wherein the insulating means is a plate disposed between the match network box and the shield box, the plate having an opening to allow the second cable to transmit RF forward current, RF forward power, and the RF return current between the plasma chamber and the match network box.

7. The system as recited in claim 6, wherein the plate is formed of at least one non-conducting material.

8. The system as recited in claim 6, wherein the plate is formed of a polymer.

9. The system as recited in claim 1, wherein the plasma chamber includes an electrostatic chuck for clamping the wafer, wherein the RF power is used to attractions to the wafer for processing.

10. An apparatus for supplying RF power to a plasma processing chamber, comprising:

an RF generator for generating RF power;

a plasma chamber arranged to receive the RF power for processing the wafer, the plasma chamber being characterized by an internal impedance during plasma processing, the plasma chamber having at least one wall for returning RF currents;

means for housing a match network circuit that is arranged to generate an impedance, which matches the internal impedance of the plasma chamber to the impedance of the RF generator, the match network housing means being capable of receiving the RF currents;

first means coupled between the RF generator and the match network housing means for transmitting RF power between the RF generator and the match network housing means;

second means coupled between the match network housing means and the plasma chamber for transmitting RF power between the match network circuit and the plasma chamber, the second means providing a return path for an RF current from the plasma chamber to the match network housing means; p1 means for electrically isolating the match network housing means from electrical contacts with the plasma chamber such that only the second means provides the return path for the RF current from the plasma chamber to the match network housing means; and means coupled between the plasma chamber and the match network housing means for shielding the second means for transmitting the RF power, wherein the isolating means blocks all return paths of the RF currents from the shielding means to the match network housing means.

11. The apparatus as recited in claim 10, wherein the first and second means are first and second coaxial cables, respectively, each of which has an inner conductor and an outer conductor, wherein the inner conductors transmit RF forward current and RF forward power and the outer conductors transmit the return current.

12. The apparatus as recited in claim 11, wherein the second cable is a rigid coaxial cable.

13. The apparatus as recited in claim 10, wherein the isolating means is a plate disposed between the match network housing means and the shielding means, the plate having an opening to allow the second cable to transmit the RF power and the RF return current between the plasma chamber and the match network housing means.

14. The apparatus as recited in claim 13, wherein the plate is formed of at least one non-conducting material.

15. The apparatus as recited in claim 13, wherein the plate is formed of a polymer.

16. A method for delivery RF power to a plasma processing chamber, comprising:

providing a wafer in a plasma processing chamber that is characterized by an internal impedance during wafer processing;

generating RF power, by an RF generator, for use in the plasma processing chamber;

receiving the RF power over a first cable and producing an impedance which matches the internal impedance of the plasma chamber to an impedance of the RF generator;

transmitting the RF power over a second cable to the plasma processing chamber for processing the wafer, the plasma processing chamber being configured to transmit RF currents; and allowing only one RF return current to be transmitted from the plasma processing chamber over the second cable.

17. The method as recited in claim 16, wherein the one RF return current is allowed to be transmitted over the second cable by blocking return paths of all other RF return currents from the plasma processing chamber.

18. The method as recited in claim 17, wherein the one RF return current is transmitted from the plasma processing chamber over the second cable to a match network box.

19. The method as recited in claim 18, wherein the one RF return current is allowed to be transmitted over the second cable by providing a plate between the match network box and the plasma processing chamber, the plate having an opening to allow the second cable to transmit RF forward current, RF forward power, and the RF return current between the plasma chamber and the match network box.

20. The method as recited in claim 19, wherein the plate is formed of at least one insulating material to electrically isolate the match network from the plasma processing chamber.

21. The method as recited in claim 20, wherein the plate is formed of a polymer.

* * * * *